(12) United States Patent
Grzeskowiak et al.

(10) Patent No.: US 12,099,299 B2
(45) Date of Patent: Sep. 24, 2024

(54) METHOD OF PATTERNING A SUBSTRATE USING A SIDEWALL SPACER ETCH MASK

(71) Applicant: Tokyo Electron Limited, Tokyo (JP)

(72) Inventors: Jodi Grzeskowiak, Schenectady, NY (US); Anthony Schepis, Albany, NY (US); Anton Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/354,388

(22) Filed: Jul. 18, 2023

(65) Prior Publication Data

US 2023/0367217 A1 Nov. 16, 2023

Related U.S. Application Data

(62) Division of application No. 17/032,980, filed on Sep. 25, 2020, now Pat. No. 11,782,346.

(60) Provisional application No. 62/905,604, filed on Sep. 25, 2019.

(51) Int. Cl.
*G03F 7/09* (2006.01)
*G03F 7/004* (2006.01)
*G03F 7/11* (2006.01)
*H01L 21/027* (2006.01)
(Continued)

(52) U.S. Cl.
CPC ............ *G03F 7/094* (2013.01); *G03F 7/0045* (2013.01); *G03F 7/091* (2013.01); *G03F 7/11* (2013.01); *H01L 21/0276* (2013.01); *H01L 21/3065* (2013.01); *H01L 21/3085* (2013.01); *H01L 21/3086* (2013.01); *H01L 21/3088* (2013.01)

(58) Field of Classification Search
CPC ............ H01L 21/0337; H01L 21/0335; H01L 21/0338; H01L 21/0334
See application file for complete search history.

(56) References Cited

U.S. PATENT DOCUMENTS

| 8,728,943 B2 | 5/2014 | Takeishi et al. |
| 9,171,716 B2 | 10/2015 | Fukuda |
| 2009/0162792 A1 | 6/2009 | Lee et al. |

(Continued)

FOREIGN PATENT DOCUMENTS

| JP | 2003140352 A | * 5/2003 |
| JP | 2004-93652 A | 3/2004 |

(Continued)

OTHER PUBLICATIONS

Japanese Office Action issued Apr. 23, 2024 in Japanese Patent Application No. 2022-513260 (with English translation), 12 pages.

(Continued)

*Primary Examiner* — Raj R Gupta
(74) *Attorney, Agent, or Firm* — Oblon, McClelland, Maier & Neustadt, L.L.P.

(57) ABSTRACT

A method for patterning a substrate in which a patterned photoresist structure can be formed on the substrate, the patterned photoresist structure having a sidewall. A conformal layer of spacer material can be deposited on the sidewall. The patterned photoresist structure can then be removed from the substrate, leaving behind the spacer material. Then, the substrate can be directionally etched using the sidewall spacer as an etch mask to form the substrate having a target critical dimension.

10 Claims, 6 Drawing Sheets

(51) Int. Cl.
  *H01L 21/3065* (2006.01)
  *H01L 21/308* (2006.01)

(56) References Cited

U.S. PATENT DOCUMENTS

| | | |
|---|---|---|
| 2011/0294075 A1 | 12/2011 | Chen et al. |
| 2013/0288487 A1 | 10/2013 | Scheer et al. |
| 2015/0241782 A1* | 8/2015 | Scheer .................... G03F 7/091 |
| | | 430/325 |
| 2016/0209749 A1* | 7/2016 | Yamamoto ................ G03F 7/40 |
| 2019/0237330 A1 | 8/2019 | Abatchev et al. |

FOREIGN PATENT DOCUMENTS

| | | |
|---|---|---|
| JP | 2015-69173 A | 4/2015 |
| JP | 2017-507372 A | 3/2017 |
| KR | 10-2007-0117347 A | 12/2007 |
| KR | 10-2012-0063390 A | 6/2012 |

OTHER PUBLICATIONS

International Search Report and Written Opinion issued Jan. 12, 2021 in PCT/US2020/052771, 10 pages.

\* cited by examiner

METHOD OF PATTERNING A SUBSTRATE USING A SIDEWALL SPACER ETCH MASK

CROSS REFERENCE TO CO-PENDING APPLICATION

This application is a divisional of U.S. patent application Ser. No. 17/032,980, filed Sep. 25, 2020, which claims the benefit of priority from U.S. Provisional Patent Application No. 62/905,604, filed Sep. 25, 2019, the entire contents of which are incorporated herein by reference.

FIELD OF THE INVENTION

Embodiments described herein relate generally to patterning a substrate.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. One specific technique is the use of sidewall spacers or, simply, spacers. Spacers are typically formed by conformally depositing a spacer material on a mandrel. The mandrel can be a topographic feature such as a line, mesa, or hole. Any of various conformal deposition processes can be used such as chemical vapor deposition (CVD) or atomic layer deposition (ALD). The result is a film that covers all surfaces (horizontal and vertical) in a film that has an approximately uniform thickness on both horizontal and vertical surfaces. Next a spacer open etch is executed. A spacer open etch is a directional (anisotropic) etch to remove an amount of spacer material at least equal to the deposited thickness. The result is removing spacer material from horizontal surface while leaving a spacer on vertical surfaces (sidewalls of various features). The spacer can then be used as a mask or structure for subsequent microfabrication. Thus, it is important that spacers have the intended structure for forming features in the substrate having the desired critical dimension.

SUMMARY

In one embodiment, this disclosure presents a method of patterning a substrate, the method comprising: forming a patterned photoresist structure on the substrate, the patterned photoresist structure having a sidewall with a predetermined sidewall slope that corresponds to a target critical dimension (CD) for a substrate feature to be formed in the substrate; depositing a conformal layer of spacer material on the sidewall; removing the patterned photoresist structure from the substrate such that the spacer material remains as a sidewall spacer formed on the substrate; directionally etching the substrate using the sidewall spacer as an etch mask to form the substrate feature having the target CD in the substrate.

In one embodiment, the forming a patterned photoresist structure comprises exposing a layer of photoresist to a pattern of actinic radiation using a mask-based photolithography system, said exposure being performed at a defocus point corresponding to the predetermined sidewall slope.

In one embodiment, the forming a patterned photoresist structure comprises: forming an underlayer of predetermined material corresponding to forming the predetermined sidewall slope, forming a layer of photoresist on the underlayer, exposing the layer of photoresist to a pattern of actinic radiation using a mask-based photolithography system, wherein the underlayer enhances the exposing a layer step to form a latent pattern structure corresponding to the patterned photoresist structure having the predetermined sidewall slope, and removing portions of the photoresist from the substrate such that the latent pattern structure remains as the patterned photoresist structure on the substrate.

In one embodiment, the forming an underlayer comprises forming a layer of material having a predetermined reflectivity configured to, during the exposure, increase an intensity of the actinic radiation in a region of the photoresist that is adjacent to the underlayer such that the latent pattern structure has the predetermined sidewall slope.

In one embodiment, the forming an underlayer comprises forming a layer of material having reactive species configured to modify a latent pattern structure in a region of the photoresist that is adjacent to the underlayer such that the latent pattern structure has the predetermined sidewall slope.

In one embodiment, said predetermined sidewall slope is configured to compensate for relaxation of stress in the layer of spacer material after the removing of the patterned photoresist structure.

In one embodiment, the layer of spacer material on the sidewall forms a first angle with respect to the substrate surface, and the sidewall spacer forms a second angle with respect to the substrate surface, said second angle being closer to perpendicular than the first angle due the relaxation of stress.

In one embodiment, the target CD is equivalent to a thickness of the layer of spacer material.

In one embodiment, the forming a patterned photoresist comprises forming another sidewall in a different region of the substrate which has another predetermined sidewall slope that corresponds to another target critical dimension (CD), the sidewall slope and another sidewall slope being configured to provide uniform CD of substrate features in different regions of the substrate.

Another embodiment further comprises forming an underlayer of predetermined material corresponding to forming the predetermined sidewall slope, forming a layer of photoresist on the underlayer, wherein the underlayer enhances the exposing step to form a latent pattern structure corresponding to the patterned photoresist structure having the predetermined sidewall slope, and removing portions of the photoresist from the substrate such that the latent pattern structure remains as the patterned photoresist structure on the substrate.

In one embodiment, this disclosure presents a method of patterning a substrate, the method comprising: depositing an anti-reflective coating layer on a substrate, the anti-reflective coating layer including a solubility-shifting component; depositing a layer of photoresist on the anti-reflective coating layer; exposing the layer of photoresist to a pattern of actinic radiation using a mask-based photolithography system, wherein a focus point of the pattern of actinic radiation is set at predetermined point that creates a latent pattern of structures having a sidewall taper in that the upper portions of the structures have wider cross-sections as compared to cross-sections of corresponding intermediate portions; diffusing the solubility-shifting component into a lower portion of the layer of photoresist; and developing the layer of photoresist resulting in photoresist structures having the sidewall taper in that a cross-sectional width of the photoresist structures decreases from a top of the photoresist structures to a bottom of the photoresist structures.

In one embodiment, the layer of photoresist contains a first photo acid generator that generates a first photo acid in response to a first wavelength of light, and wherein the solubility shifting component is a second photo acid that is a component of a second photo acid generator that generates the second photo acid in response to a second wavelength of light.

In one embodiment, the first wavelength of light is different from the second wavelength of light.

Another embodiment further comprises executing a flood exposure on the substrate of the second wavelength of light subsequent to exposing the layer of photoresist to the pattern of actinic radiation using the mask-based photolithography system.

In one embodiment, the first wavelength of light is equivalent to the second wavelength of light.

In one embodiment, exposure from the pattern of actinic radiation using the mask-based photolithography system is sufficient to generate an amount of photo acid from the second photo acid generator.

In one embodiment, the solubility-shifting component is acid deposited on the anti-reflective coating layer.

In one embodiment, the solubility-shifting component is free acid within the anti-reflective coating layer.

Another embodiment further comprises forming sidewall spacers on the photoresist structures, the sidewall spacers adopting the sidewall taper of the photoresist structures; and removing the photoresist structures.

In one embodiment, removing the photoresist structures results in top portions of sidewall spacers from a given photoresist structure decreasing in geometrical distance from each other as the given photoresist structure is removed.

In one embodiment, the anti-reflective coating layer is partially-reflective and sufficient to reflect a portion of the pattern of actinic radiation back into the layer of photoresist to generate more photo acid at bottom portions of the layer of photoresist.

In one embodiment, a concentration of the solubility-shifting component in the anti-reflective coating layer is selected so that a sum of photo acid generated from the layer of photoresist and photo acid generated from the anti-reflective coating layer is sufficient to result in the photoresist structures having the sidewall taper.

In one embodiment, this disclosure presents a method of patterning a substrate, the method comprising: depositing an anti-reflective coating layer on a substrate; depositing a layer of photoresist on the anti-reflective coating layer; exposing the layer of photoresist to a pattern of actinic radiation using a mask-based photolithography system, wherein a focus point of the pattern of actinic radiation is set at predetermined point that creates a latent pattern of structures having a sidewall taper in that the upper portions of the structures have wider cross-sections as compared to cross-sections of corresponding lower portions; and developing the layer of photoresist resulting in photoresist structures having the sidewall taper in that a cross-sectional width of the photoresist structures decreases from a top of the photoresist structures to a bottom of the photoresist structures.

In one embodiment, this disclosure presents a method of patterning a substrate, the method comprising: identifying an effective spacer CD to result from spacers formed on a substrate depositing an anti-reflective coating layer on a substrate; depositing a layer of photoresist on the anti-reflective coating layer; exposing the layer of photoresist to a pattern of actinic radiation using a mask-based photolithography system, wherein a focus point of the pattern of actinic radiation is set at predetermined point that creates a latent pattern of structures having a predetermined sidewall taper; developing the layer of photoresist resulting in photoresist structures having the predetermined sidewall taper; forming sidewall spacers on the photoresist structures, the sidewall spacers adopting the predetermined sidewall taper; and removing the photoresist structures from the substrate resulting in the sidewall spacers having a modified sidewall taper that creates the effective spacer CD when transferring a pattern defined by the sidewall spacers into an underlying layer.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

DETAILED DESCRIPTION

As noted in the Background, it is important that spacers have the intended structure for forming features in the substrate having the desired critical dimension (CD). Spacers can be formed on mandrels of any material. Typically a first material formed into a topographic relief pattern is photoresist. Accordingly, forming spacers on photoresist patterns is desirable. A significant challenge with using photoresist as a mandrel is that photoresist is a relatively soft material and is often developed with profiles that do not have vertical profiles. Sidewalls can be leaning inwardly or outwardly depending on how a photolithographic exposure is executed. Moreover, when spacers are deposited on some photoresist or other soft mandrels, compressive or tensile stresses in a deposited film can change a profile of the soft mandrels. For example, spacers can be leaning or not perfectly normal to the substrate surface. Spacers are often used as an etch mask for pattern transfers using a directional etch. Leaning spacers can then cause an effective critical dimension to be much larger than a thickness of the spacer.

Another challenge with using photoresist mandrels is that sidewall spacers can have a first angle while the photoresist is on the substrate, but when the photoresist is removed (exhumed), this removal process often results in the sidewall spacers changing an angle relative to the substrate. So even if initial sidewall spacers were perfectly normal to the substrate, the mandrel removal process can result in sidewall spacers having a different angle, such as leaning more toward each other.

Figure 1:
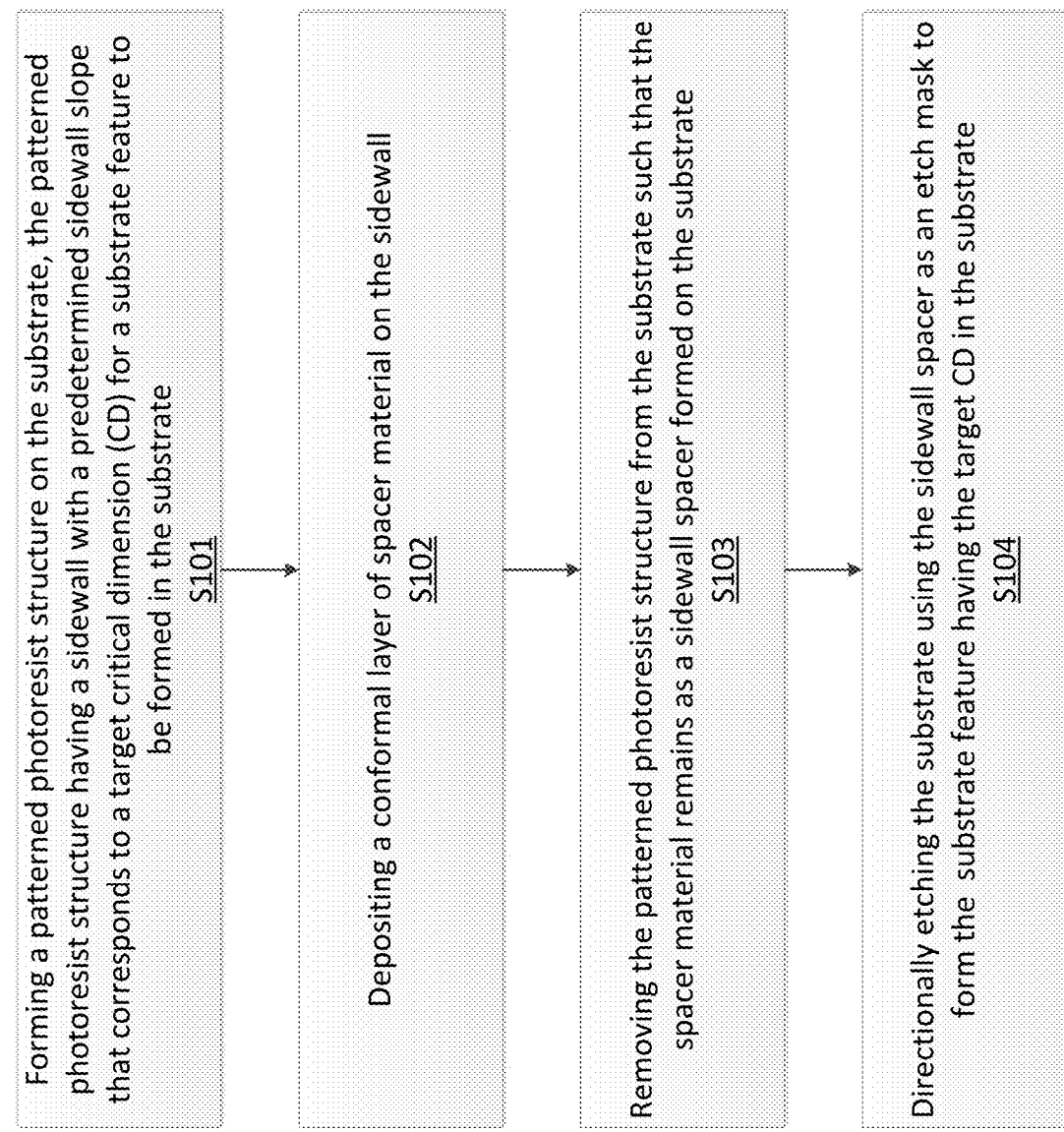
FIG. 1 is a flow chart for one method of patterning a substrate.

FIG. 1 is a flowchart walking through a method 100 for one embodiment of patterning a substrate.

The first step, S101, is forming a patterned photoresist structure on the substrate, the patterned photoresist structure having a sidewall with a predetermined sidewall slope that corresponds to a target critical dimension for a substrate feature to be formed in the substrate. Then, S102 is depositing a conformal layer of spacer material on the sidewall. Next, S103 is removing the patterned photoresist structure from the substrate such that the spacer material remains as a sidewall spacer formed on the substrate. Last, S104 is directionally etching the substrate using the sidewall spacer as an etch mask to form the substrate feature having the target CD in the substrate. The patterned photoresist structure on the substrate can be formed using one or more of the disclosed techniques, including using retrograde focus, an underlayer to modulate reflectivity, and/or an underlayer loaded with a reactive species to result in a predetermined sidewall taper or slope.

Figure 2:
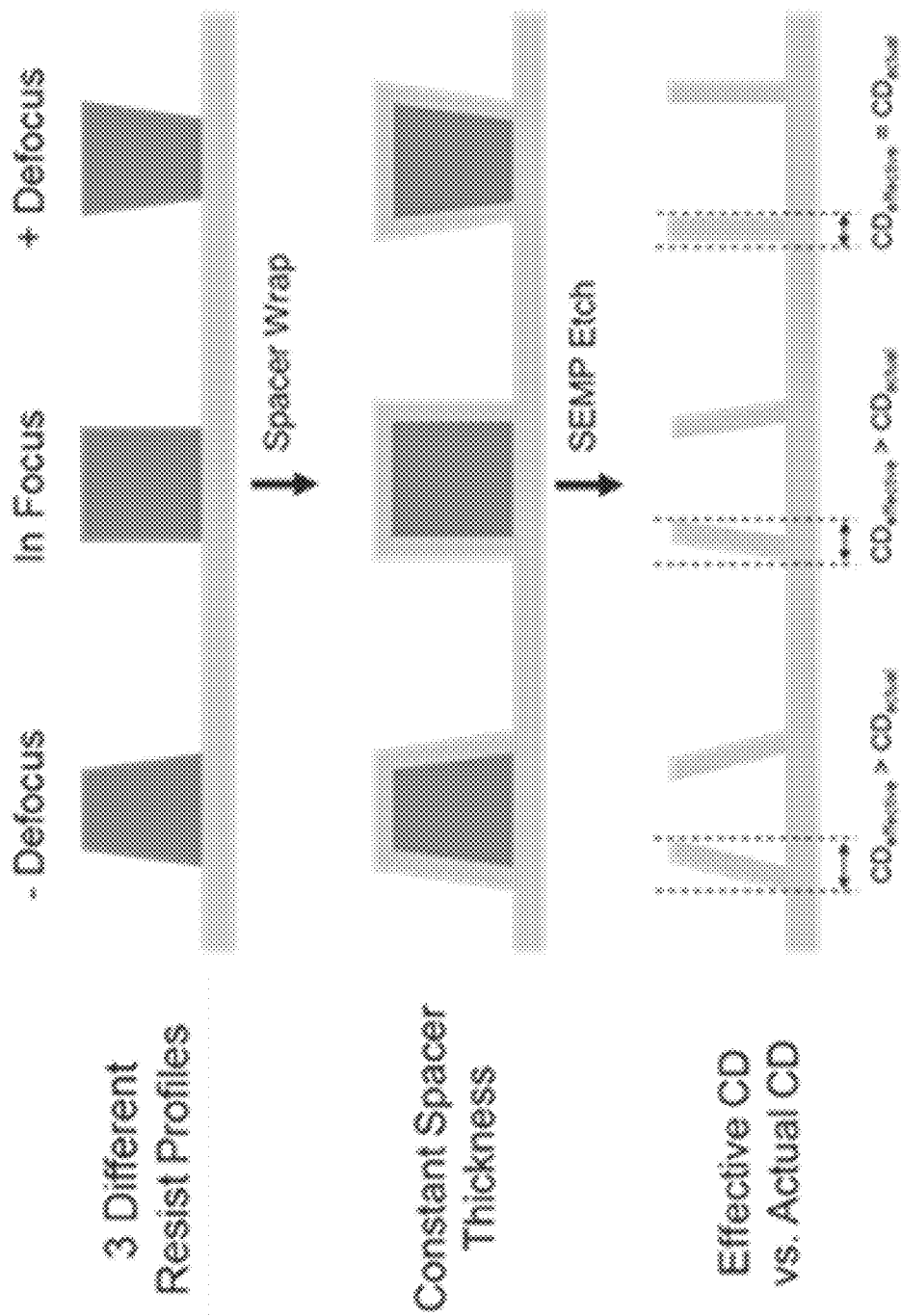
FIG. 2 illustrates three different resist profile cases, the resist profiles after a spacer wrap creating a constant spacer thickness, and the effective critical dimension versus actual critical dimension for each of the resist profiles after a spacer etch mandrel pull (SEMP) etch.

The disclosed techniques provide effective spacer CD control for spacers formed on soft mandrels. That is, disclosed techniques can tune or correct different incoming photoresist (i.e. resist) profiles using various methods. FIG. 2 shows a conceptual illustration of resist profile cases and the resulting effective spacer CD. Cross-sectional illustrations of 3 different resist profiles on a substrate are shown in the top/first row (labelled "3 Different Resist Profiles") of FIG. 2, where the photoresist mandrel on the left (labelled "−Defocus") has a wider base and narrows to the top, the photoresist mandrel in the middle (labelled "In Focus") has a base and top with approximately the same width, and the photoresist mandrel on the right (labelled "+Defocus") has a wider top and narrows to the base. The term "effective spacer CD" is used herein to refer to a projected CD during an RIE (reactive ion etch) transfer. In other words, from a z-direction perspective, a leaning spacer will create a shadow larger than its thickness, and this shadowed area can become the effective CD. The term "actual CD" is used herein to refer to a thickness of the spacer. When a spacer has a vertical or near vertical orientation, the actual CD is transferred during an RIE transfer. An example illustration of effective CD vs actual CD is shown in the bottom/third row (labelled "Effective CD vs. Actual CD") of FIG. 2.

Because an RIE etch is a directional (anisotropic) etch, a pattern that is transferred is a shadow of the mask. Thus, a leaning spacer can shadow more than a thickness of a given spacer. A transferred CD can then appear larger than the actual CD because of shadowing from leaning. This is illustrated in the bottom row of FIG. 2. Note that an amount of shadowing or effective CD is depending on an angle of leaning. The first row of FIG. 2 shows how an incoming resist profile can have various degrees of sidewall angles. In the second/middle row (labelled "Constant Spacer Thickness") of FIG. 2, a deposited spacer from a spacer wrap can follow the profile of the incoming resist mandrel. Some spacer material can also further compress a given photoresist material.

A spacer deposition is a mostly uniform process in which one cannot control the amount of deposition as a function of location on a single wafer in order to modulate spacer CD. In other words, deposition is uniform across the wafer. Techniques disclosed, however, control effective spacer CD at specific locations on a wafer for cross-wafer control by providing additional knobs to tune the process. A spacer can then be deposited directly on the photoresist which has a modified profile depending on the desired effective CD. Note that sidewall spacers can have a first angle while the photoresist is on the substrate, but when the photoresist is removed (exhumed), this removal process often results in the sidewall spacers changing an angle relative to the substrate. So even if initial sidewall spacers were perfectly normal to the substrate, the mandrel removal process can result in sidewall spacers having a different angle, such as leaning more toward each other. This can be seen in FIG. 2. As shown on the left side of FIG. 2 ("−Defocus" column), when the photoresist mandrel has a wider base then top, there is an angled sidewall spacer, and after removal, the angle of lean increases. As shown in the middle column of FIG. 2 ("In Focus" column), even with perfectly vertical spacers, removal of the photoresist mandrel can cause spacer leaning. Accordingly, techniques herein include forming photoresist mandrels with a retrograde slope or reverse taper; for example, a mandrel with a wider top that narrows to base. Initially formed sidewall spacers will then not be perpendicular to the substrate, but after removal of the photoresist mandrel, the removal result in spacers that are normal or perpendicular to the substrate, as can be seen in the right side column of FIG. 2 ("+Defocus" column). Thus, in one embodiment, having a reverse taper (i.e. retrograde) profile to result in straight sidewall spacers is presented. That is, the layer of spacer material on the sidewall may form a first predetermined angle that is far from perpendicular with respect to the substrate surface, but designed to compensate for relaxation of stresses upon removal of the photoresist. Then, after removal of the photoresist, the sidewall spacer can form a second angle that approaches perpendicular (closer to perpendicular than the first angle) due the relaxation of stress.

Figure 3:
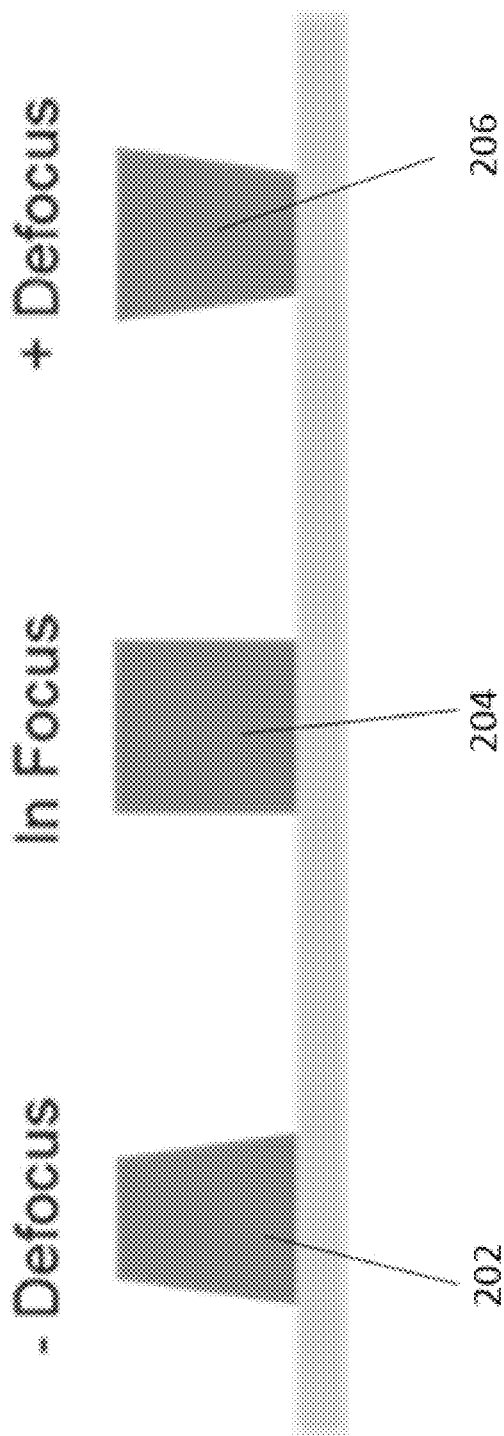
FIG. 3 shoes three different resist profiles, where the resist for "−Defocus" has a wider bottom that narrows to the top, the resist for "In Focus" has a top and bottom of approximately equal width, and the resist for "+Defocus" has a wider top that narrows to the bottom.
Figure 4:
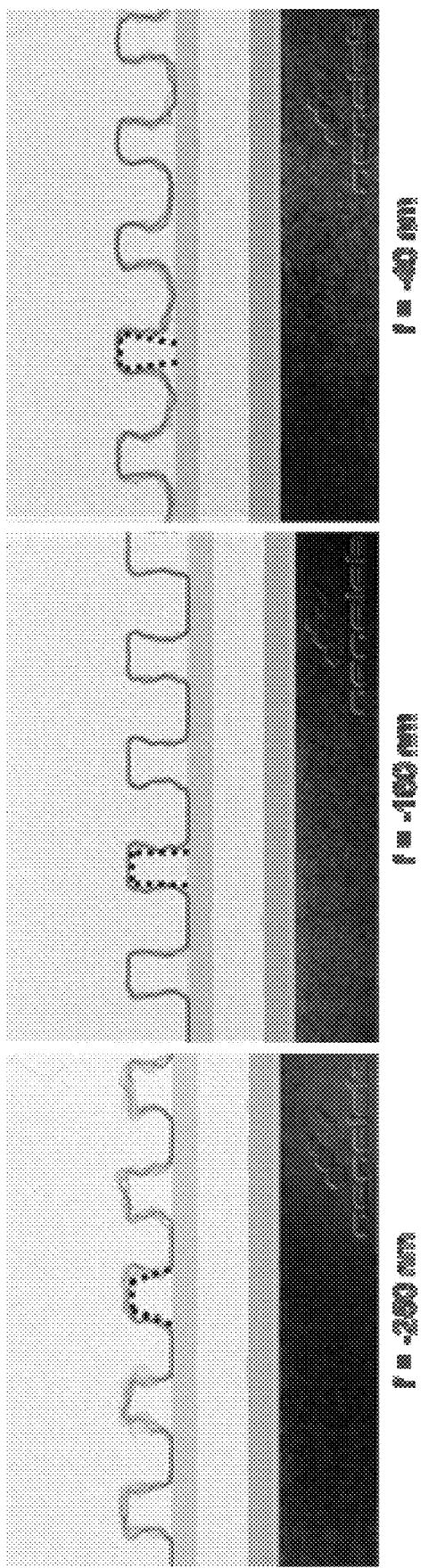
FIG. 4 shows cross-section transmission electron microscopy (TEM) images showing resist profile tuning by varying focus, where dose=34 mJ/cm$^2$.

One embodiment includes a retrograde focus technique. This includes adjusting focus to modulate a resist profile and side-wall angle (SWA) which impacts the effective spacer CD. Focus offset can be performed on a scanner or a stand-alone platform. FIG. 3 illustrates results of a resist 204 in focus, the resist 202 with focus decreased, and the resist 206 with focus increased. A focal point of an exposure pattern is essentially raised to a point higher about the layer of photoresist then would normally be used. This is a change of focus in the z-direction. While this positive defocus results in exposing sidewalls at an angle, the change in central point of focus—for some photoresists—can mean the exposure is less likely to cause de-protection reactions at a bottom of the layer of photoresist. FIG. 4 is a cross-sectional magnified image of photoresist being tuned by adjusting a focus (f) of the exposure. In this particular example, the dose was 34 mJ/cm$^2$. Note that in the image on the right (f=−40 nm) of FIG. 4, upper portions of the lines (mandrels) have a reverse taper, but each line has a footer. Accordingly, techniques herein can also augment exposure to assist with removal of the footer.

Techniques herein include using a secondary acid (or base) deliver to augment an initial exposure to remove footers. There are several alternative embodiments.

Figure 5:
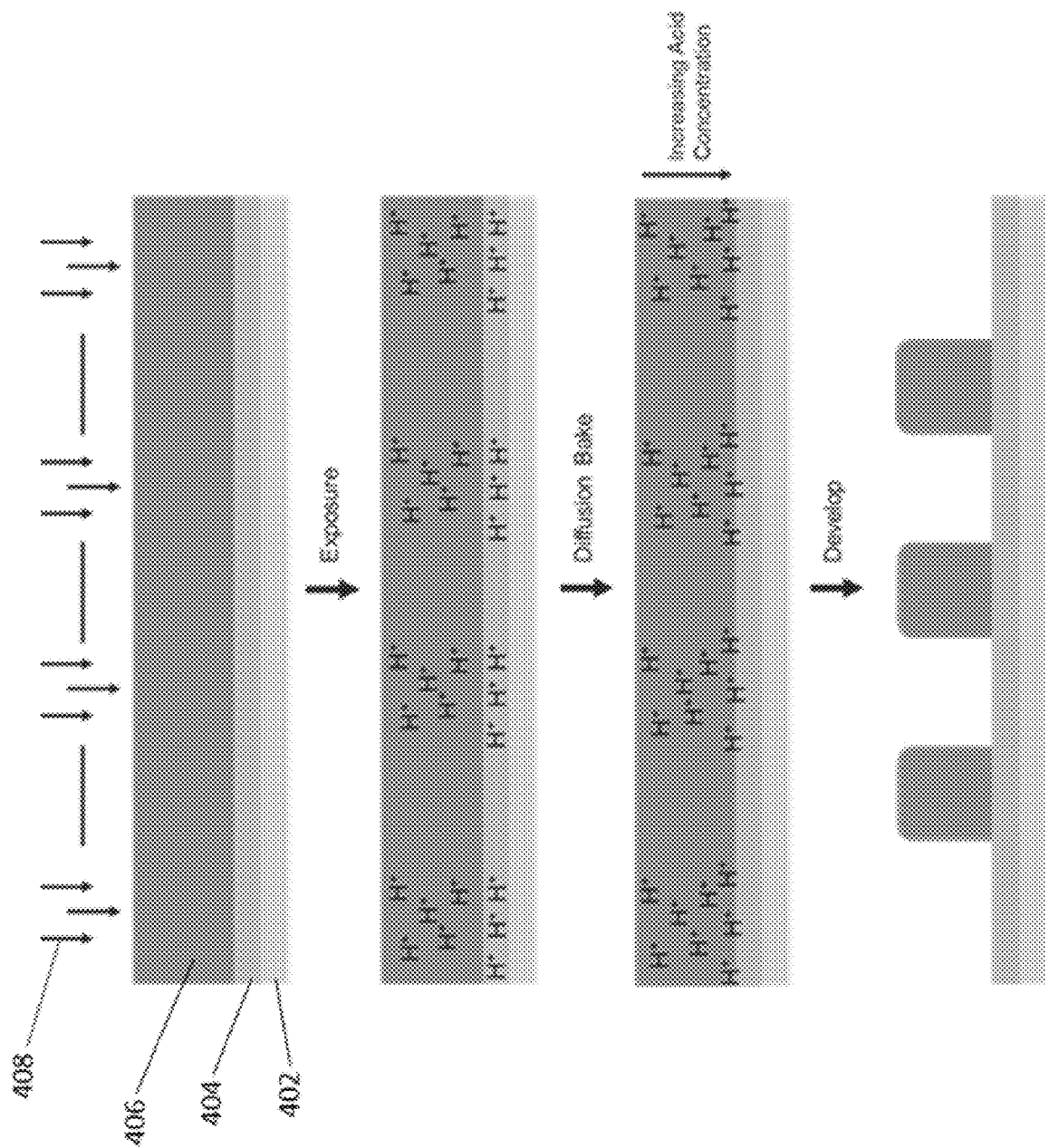
FIG. 5 illustrates an example of controlling profile via reactive species loaded into an underlayer, where the underlayer contains a reactive species (e.g. photo acid generator PAG) to generate acid, where that acid is then diffused into photoresist, which increases the concentration of acid in the bottom of the photoresist.

In one embodiment, reactive species are loaded into an underlayer (e.g. anti-reflective coating (ARC) layer). One example of a reactive species is an acid. Acid within the underlayer diffuses into the resist from the underlayer, thus increasing acid concentration at the bottom of the exposure region. Extra light is absorbed as opposed to reflecting it (which does not suffer from standing waves) and produces additional acid diffusing it into the bottom of the resist, aiding in foot mitigation as well as side wall angle adjustment. Thus, the underlayer can augment or enhance the exposure step to provide a greater concentration of acid than would be provided without the underlayer, which provides a corresponding greater removal of resist upon development of the resist after exposure. As another example, the underlayer can include a base that augments or enhances the exposure step to provide a greater concentration of base than would be provided without the underlayer, which provides a corresponding lesser removal of resist upon development of the resist after exposure. Further, the underlayer can be made more reflective to some degree, which can increase radiation intensity to release a greater concentration of acid from the photoresist itself near the interface with the underlayer. FIG. 5 is a diagram of a substrate segment illustrating progression of mask-based lithographic exposure with underlayer loading. FIG. 5 comprises a resist 406 (i.e. photoresist), an underlayer 404, and a substrate 402. In this example, the underlayer 404 (i.e. underlying layer) contains a photo acid generator (PAG) to generate acid (e.g. Hf). Alternatively a base could be used. The PAG is reactive to actinic radiation 408 from a mask-based exposure. After generation of the acid, the acid is diffused into the resist 406 with a bake step. This increases a concentration of acid in bottom portions of the resist 406. Note that the layer of photoresist 406 includes photo-reactive species, such as a PAG, but activation at lower portions of the layer of photoresist 406 can be less than activation at upper portions of the layer of photoresist 406. Thus, having a second supply of acid that can be brought into the layer of photoresist 406 from the underlayer can assist with uniform protection/deprotection (solubility changing) to be able to increase resolution or sidewall angle during development.

Figure 6:
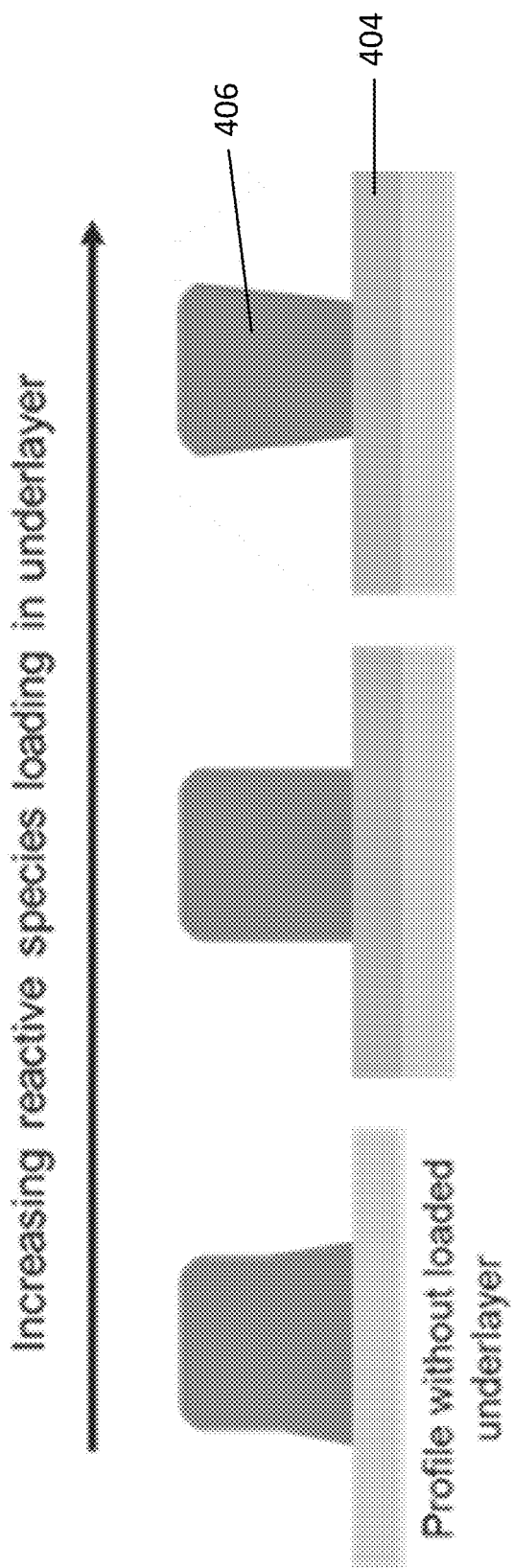
FIG. 6 illustrates resist profile as a function of reactive species concentration loaded into the underlayer, where, for example, as the amount of acid increases in the underlayer, the concentration gradient in the resist becomes steeper.

FIG. 6 illustrates how the use of reactive species loading into the underlayer 404 can be used as foot mitigation as well. Profile is a function of reactive species concentration loaded into the underlayer 404. For this example, as the amount of acid increases in the underlayer 404, the concentration gradient in the resist becomes steeper, as shown by the different shapes of photoresist 406.

In embodiments with two different PAGs (one in the photoresist and one in the ARC layer), they can be responsive to the same wavelength of light or different wavelengths of light (out-of-band illumination). For example, after an initial patterned exposure using a 193 nm wavelength scanner, an I-line flood exposure can be executed to activate an amount of PAG in the ARC. Note that with a flood exposure, photo acid will be generated uniformly, but the amount generated can be insufficient by itself to dissolve the layer of photoresist, but when combined with another acid, the sum is sufficient for dissolution. For example, the trenches can receive a certain amount of acid, and the under layer can provide a remaining amount of acid to remove footers and yield the reverse taper profile. In another embodiment, more than two PAGs may be used to achieve the desired results.

In another embodiment, underlayer reflectivity is modulated. An amount of reflectivity of a given underlayer is adjusted by changing a material composition. By reflecting more light from the underlayer, an acid concentration near the underlayer increases and affects the resist profile. In other embodiments, a thickness of the anti-reflective coating can be adjusted for desired acid concentration and/or reflectivity.

Accordingly, in one example embodiment, a side-wall angle adjustment can adjust the effective CD by sub-nanometer to nanometer corrections.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate, the method comprising:
    depositing an anti-reflective coating layer on a substrate, the anti-reflective coating layer including a solubility-shifting component;
    depositing a layer of photoresist on the anti-reflective coating layer;
    exposing the layer of photoresist to a pattern of actinic radiation using a mask-based photolithography system, wherein a focus point of the pattern of actinic radiation is set at predetermined point that creates a latent pattern of structures having a sidewall taper in that the upper portions of the structures have wider cross-sections as compared to cross-sections of corresponding intermediate portions;

diffusing the solubility-shifting component into a lower portion of the layer of photoresist; and developing the layer of photoresist resulting in photoresist structures having the sidewall taper in that a cross-sectional width of the photoresist structures decreases from a top of the photoresist structures to a bottom of the photoresist structures.

2. The method of claim 1, wherein the layer of photoresist contains a first photo acid generator that generates a first photo acid in response to a first wavelength of light, and wherein the solubility-shifting component is a second photo acid that is a component of a second photo acid generator that generates the second photo acid in response to a second wavelength of light.

3. The method of claim 2, wherein the first wavelength of light is different from the second wavelength of light.

4. The method of claim 3, further comprising executing a flood exposure on the substrate of the second wavelength of light subsequent to exposing the layer of photoresist to the pattern of actinic radiation using the mask-based photolithography system.

5. The method of claim 1, wherein the solubility-shifting component is acid deposited on the anti-reflective coating layer.

6. The method of claim 1, wherein the solubility-shifting component is free acid within the anti-reflective coating layer.

7. The method of claim 1, further comprising:

forming sidewall spacers on the photoresist structures, the sidewall spacers adopting the sidewall taper of the photoresist structures; and removing the photoresist structures.

8. The method of claim 7, wherein removing the photoresist structures results in top portions of sidewall spacers from a given photoresist structure decreasing in geometrical distance from each other as the given photoresist structure is removed.

9. The method of claim 1, wherein the anti-reflective coating layer is partially-reflective and sufficient to reflect a portion of the pattern of actinic radiation back into the layer of photoresist to generate more photo acid at bottom portions of the layer of photoresist.

10. The method of claim 1, wherein a concentration of the solubility-shifting component in the anti-reflective coating layer is selected so that a sum of photo acid generated from the layer of photoresist and photo acid generated from the anti-reflective coating layer is sufficient to result in the photoresist structures having the sidewall taper.

* * * * *